(12) United States Patent
Goldflam et al.

(10) Patent No.: US 11,674,850 B1
(45) Date of Patent: Jun. 13, 2023

(54) CONTINUOUS FULL-RESOLUTION TWO-COLOR INFRARED DETECTOR

(71) Applicant: National Technology & Engineering Solutions of Sandia, LLC, Albuquerque, NM (US)

(72) Inventors: Michael Goldflam, Albuquerque, NM (US); David W. Peters, Albuquerque, NM (US); Paul Davids, Albuquerque, NM (US); Jin K. Kim, Albuquerque, NM (US); Evan Michael Anderson, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 242 days.

(21) Appl. No.: 17/230,159

(22) Filed: Apr. 14, 2021

Related U.S. Application Data

(60) Provisional application No. 63/013,868, filed on Apr. 22, 2020.

(51) Int. Cl.
| | |
|---|---|
| *G01J 5/24* | (2006.01) |
| *G01J 5/08* | (2022.01) |
| *H01L 31/0232* | (2014.01) |
| *H01L 31/09* | (2006.01) |
| *H01L 27/146* | (2006.01) |
| *G01J 5/20* | (2006.01) |

(52) U.S. Cl.
CPC ............. *G01J 5/0837* (2013.01); *G01J 5/24* (2013.01); *H01L 27/14652* (2013.01); *H01L 31/02327* (2013.01); *H01L 31/09* (2013.01); *G01J 2005/202* (2013.01)

(58) Field of Classification Search
CPC ...... G01J 5/0837; G01J 5/24; G01J 2005/202; H01L 27/14652; H01L 31/02327; H01L 31/09
See application file for complete search history.

(56) References Cited

U.S. PATENT DOCUMENTS

| | | | | |
|---|---|---|---|---|
| 4,654,622 | A * | 3/1987 | Foss | .......................... H01Q 5/42 338/14 |
| 8,750,653 | B1 | 6/2014 | Peters et al. | |
| 10,439,093 | B2 * | 10/2019 | Yao | .......................... H01L 31/00 |

(Continued)

OTHER PUBLICATIONS

Goldflam, M.D. et al., "Enhanced infrared detectors using resonant structures combined with thin type-II superlattice absorbers," Applied Physics Letters, 2016, vol. 109, 251103.

(Continued)

*Primary Examiner* — Marcus H Taningco
(74) *Attorney, Agent, or Firm* — Martin I. Finston; Mark A. Dodd

(57) ABSTRACT

An apparatus is provided for nanoantenna-enhanced detection of infrared radiation. The apparatus includes one or more detector pixels. A plurality of detector pixels can constitute a focal plane array (FPA). Each detector pixel carries at least a first and a second subpattern of nanoantenna elements, with elements of the second subpattern interpolated between elements of the first subpattern. Each detector pixel also includes separate collection electrodes for collecting photogenerated current from the respective subpatterns.

13 Claims, 15 Drawing Sheets

(56) References Cited

U.S. PATENT DOCUMENTS

| | | | | | |
|---|---|---|---|---|---|
| 2006/0076493 | A1* | 4/2006 | Bluzer | .................. | G01J 5/22 374/E17.002 |
| 2009/0072145 | A1* | 3/2009 | Peczalski | .................. | G01J 5/08 250/339.04 |
| 2014/0338712 | A1* | 11/2014 | Porod | .................. | H01L 35/32 136/200 |
| 2015/0365043 | A1* | 12/2015 | Sarabandi | .................. | G01J 5/20 257/461 |
| 2020/0025619 | A1* | 1/2020 | Almasri | .................. | G01J 5/024 |
| 2020/0082234 | A1* | 3/2020 | Bouchon | .......... | G06K 19/06028 |
| 2020/0295075 | A1* | 9/2020 | Goldstein | .................. | H04N 5/33 |

OTHER PUBLICATIONS

Campione, S. et al., "Improved quantitative circuit model of realistic patch-based nanoantenna-enabled detectors," Journal of the Optical Society of America B, 2018, vol. 35, pp. 2144-2152.

Olson, B. V. et al., "Auger recombination in long-wave infrared InAs/InAsSb type-II superlattices," Applied Physics Letters, 2015, vol. 107, 261104.

Gies, S. et al., "Light-matter interaction at near-infrared between a plasmonic metasurface and InAs/AlSb semiconductor heterostructure," 2019, SAND2019-9940A, Sandia National Laboratories, Albuquerque, NM.

Gies, S. et al., "Light-matter interaction at near-infrared between a plasmonic metasurface and InAs/AlSb semiconductor heterostructure," 2019, SAND2019-10931c, Sandia National Laboratories, Albuquerque, NM.

Steenbergen, E. H. et al., "Significantly improved minority carrier lifetime observed in a long-wavelength infrared 111-V type-11 superlattice comprised of 1nAs/1nAsSb," Applied Physics Letters, 2019, vol. 99, 251110.

Kim, S.J. et al., "Creating semiconductor metafilms with designer absorption spectra," Nature Communications, 2015, DOI: 10.1038/ncomms8591.

Goldflam, M. D. et al., "Next-Generation Infrared Focal Plane Arrays for High-Responsivity Low-Noise Applications," 2017, 2017 IEEE Aerospace Conference.

Goldflam, M. D. et al., "Next-Generation Infrared Focal Plane Arrays for High-Responsivity Low-Noise Applications," 2017, SAND2017-2747C, Sandia National Laboratories, Albuquerque, NM.

* cited by examiner

CONTINUOUS FULL-RESOLUTION TWO-COLOR INFRARED DETECTOR

CROSS-REFERENCE TO RELATED APPLICATION

This application claims the benefit of U.S. Provisional Application No. 63/013,868, filed Apr. 22, 2020, the entirety of which is hereby incorporated herein by reference.

STATEMENT OF GOVERNMENT RIGHTS

This invention was made with United States Government support under Contract No. DE-NA0003525 between National Technology & Engineering Solutions of Sandia, LLC and the United States Department of Energy/National Nuclear Security Administration. The United States Government has certain rights in this invention.

TECHNICAL FIELD

This invention relates to solid-state imaging infrared detectors.

BACKGROUND OF THE INVENTION

Infrared imaging systems have many important uses in fields such as navigation and surveillance, among others. In a typical application, the optical image is formed on a focal plane array (FPA), where a two-dimensional array of solid-state photodetectors transduces the optical image to electronic pixel values for readout.

It is typical in the field of electronic imaging to logically subdivide the image on a focal plane into a multiplicity of picture elements, commonly referred to as "pixels". A portion of the detector array dedicated to a single logically defined image pixel may also be referred to as a "pixel". Such a portion of the detector array will typically comprise one or more individual detector elements. To avoid ambiguity, the following discussion will use the term "detector pixel" to denote a portion of the detector array dedicated to an individual logically defined picture element. Unless the context implies otherwise, the unmodified term "pixel" will denote an individual logically defined picture element.

Individual photodetectors can be made wavelength selective. That is, in at least some detector technologies, different detectors can be tailored to respond preferentially to different wavelength bands. Below, we will loosely refer to these wavelength bands as "color channels", although it should be understood that this term is meant to include bands of infrared wavelengths that are outside of the visual range and therefore lack "color" in the ordinary sense of the term.

FPAs and other sensor arrays that discriminate between two (or more) colors offer distinct advantages for image recognition and temperature sensing, among other things. FPAs that have two distinct color channels have been developed. In current approaches to two-channel imaging, however, there is a lateral or vertical separation between the differently "colored" detector elements. These spatial separations incur a cost in efficiency or other performance metrics.

In approaches based on lateral separation, the respectively colored sensor elements are configured in a coplanar checkerboard-like array. The lateral separation between sensor elements minimizes crosstalk, and it enables images to be taken in both colors simultaneously. However, the spatial resolution is halved for each color. Because of the spatial offset between respectively colored detector pixels, image registration is prone to error.

Further, the detector external quantum efficiency is limited by the areal coverage of each channel because only a subset of the detector area is sensitive to each respective color.

In approaches based on vertical separation, the respectively colored sensor elements are stacked one above the other. Such stacked architectures avoid the errors in spatial registration suffered by the laterally separated approaches, but other problems arise. For example, the respective detector layers are typically biased to read out one color or the other. This introduces a temporal shift between color frames that could, again, cause registration errors, especially for fast-moving objects.

There may also be problems with crosstalk between color channels. To avoid false signals from the lower detection layer, the absorbers in the upper layer should be thick enough to absorb all of the light in their assigned color channel, but that can limit carrier collection from the upper layer. Hence, design tradeoffs necessitating some crosstalk are unavoidable.

Thus, there is still a need for new detector architectures that can provide two-color, or multicolor, imaging with improved efficiency, lower crosstalk, and more accurate registration.

SUMMARY OF THE INVENTION

We have devised a two-color infrared detector that collects light of both colors without apportioning detector pixels between colors. Our new detector collects both colors concurrently, with little or no spatial fill-factor loss, with simultaneous readout of both colors, and with low crosstalk between color channels. Consequently, the end user can potentially see both colors with high efficiency at every detector pixel without registration errors, even for dim objects.

Briefly, the detector comprises an array of nanoantenna-enabled detector pixels. Each detector pixel includes a detector layer overlain by a periodic subwavelength nanoantenna pattern. By "subwavelength" is meant that the nanoantenna pattern is made up of individual antenna elements that are subwavelength in lateral extent, relative to the vacuum wavelengths at the centers of the respective color channels that they are meant to enable.

Within each detector pixel, the detector layer is formed as a thin layer, which in non-limiting example embodiments is a thin epitaxial III-V layer. An optically resonant Fabry-Perot cavity is defined between the faces of the detector layer. The nanoantenna patterning couples to the resonant cavity in such a way that light is concentrated within the detector layer. The wavelength at which peak resonance takes place is jointly determined by the Fabry-Perot resonance (i.e., by the thickness and refractive index of the detector layer) and the nanoantenna dimensions. This arrangement boosts in-band quantum efficiency and reduces dark current relative to conventional detectors.

Significantly, we have recognized that a subwavelength nanoantenna can have an optical cross-section that exceeds its physical size. In our detector, this observation is exploited by interleaving two different nanoantenna subpatterns. That is, we alternate nanoantenna elements designed to resonate at a first wavelength with nanoantenna elements designed to resonate at a second wavelength different from the first. With suitable spacing between the respective elements, we can exceed 50% fill-factor collection of each wavelength, even though each subpattern covers only 50% of the total detector area.

In embodiments, the two color channels of each detector pixel can be biased and read out concurrently.

Accordingly, the invention in one aspect relates to an apparatus for optical detection comprising at least one detector pixel in which a nanoantenna pattern is disposed on a semiconductor photodetector. The nanoantenna pattern comprises a plurality of nanoantenna elements of a first size arranged in a first subpattern, and a plurality of nanoantenna elements of a second size, different from the first size, arranged in a second subpattern. The first and second subpatterns are staggered such that nanoantenna elements of one of the subpatterns are interpolated laterally between nanoantenna elements of the other subpattern. The detector pixel includes a first collection electrode for collecting photogenerated current from the first subpattern and a second collection electrode for collecting photogenerated current from the second subpattern.

In embodiments, the first and second subpatterns each consist of a plurality of columns, and the columns of the first subpattern alternate with columns of the second subpattern. Although not critical, such a columnar arrangement is useful because it facilitates readout, as will be seen below. In more specific embodiments, each column of the first and second subpatterns consists of a periodic array of pad-like nanoantenna elements.

In embodiments, each detector pixel belongs to a plurality of similar detector pixels disposed on a common semiconductor substrate. In more specific embodiments, the plurality of similar detector pixels constitute a focal plane array (FPA). In still more specific embodiments, the FPA further comprises a read-out integrated circuit (ROIC) connected to the common semiconductor substrate such that the ROIC receives an input from the first collection electrode and from the second collection electrode of each detector pixel in the plurality of similar detector pixels.

In embodiments, each detector pixel is configured to resonate at two optical frequencies that correspond to respective vacuum wavelengths. Resonant frequencies are jointly determined by the optical thickness of the semiconductor detector and the dimensions of the nanoantenna elements. Accordingly, the nanoantenna elements of the first and second subpatterns are dimensioned, in embodiments, to provide resonances at respective resonant vacuum wavelengths. The lateral dimensions of the nanoantenna elements in both subpatterns are smaller than their respective resonant vacuum wavelengths.

DETAILED DESCRIPTION

An architecture for a nanoantenna-enabled infrared detector was described in U.S. Pat. No. 8,750,653, which issued to David W. Peters et. al. on Jun. 10, 2014, which is commonly owned herewith, and the entirety of which is hereby incorporated herein by reference.

Figure 1:
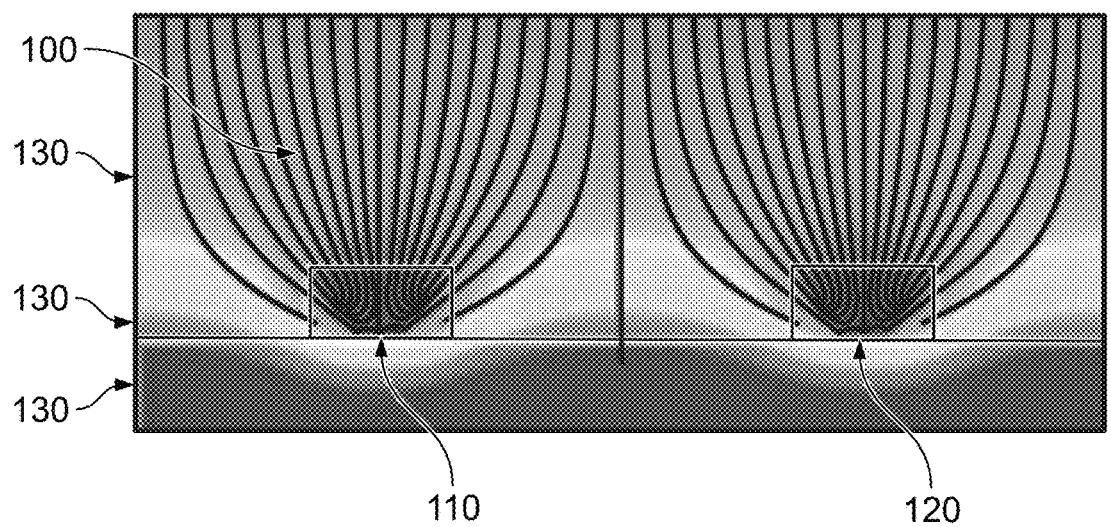
FIG. 1 is a rendering of the electric field streamlines due to an identical pair of subwavelength nanoantenna elements. Also included in the figure are contours of logarithmic electric field intensity. The figure is derived from an idealized numerical simulation.

FIG. 1 is a rendering of the electric field streamlines 100 due to an identical pair of subwavelength nanoantenna elements 110, 120. These elements are assumed to be part of a larger periodic array. Also included in the figure are intensity contours 130 of logarithmic electric field intensity. The figure is derived from an idealized numerical simulation.

It is evident in FIG. 1 that the optical cross-sections of the nanoantenna elements are greater than the lateral extent of the elements themselves, as judged from the field distribution at distances away from the nanoantenna that are comparable to or greater than the element-to-element separation. Approaching each antenna element from the far field, it is seen that the electric field streamlines are funneled toward the smaller footprint of the physical antenna element.

Generally (although not necessarily in all cases), the nanoantenna elements are sub-wavelength in at least one lateral dimension. By "sub-wavelength" is meant smaller than the vacuum wavelength of the radiation that is intended to excite resonance in operation of the detector.

It is also evident in the figure that beyond the near field, the field distribution is substantially uniform even though there is empty space between the respective antenna elements. We exploit the large optical cross-section by adding a second set of nanoantenna elements and interleaving them between the nanoantenna elements of the first set. The nanoantenna elements of the first and second sets are designed to resonate at respective first and second wavelengths that correspond to different color channels.

For example, the nanoantenna elements may be disposed within the tiles of a uniform one-dimensional or two-dimensional tiling of the detection surface. Every tile contains nanoantenna elements of the first set, except that in at least one lateral dimension, every n'th tile instead contains nanoantenna elements of the second set. Illustrative embodiments of this kind are described below. In the embodiments that we describe below, the antenna elements are arranged in columns, and antenna elements of the respective first and second sets occupy alternating columns.

Such arrangements make it possible to collect light at each respective wavelength with a fill factor as great as 100%, even though each respective subpattern of nanoantenna elements covers, e.g., only 50% of the detector area.

Figure 2A:
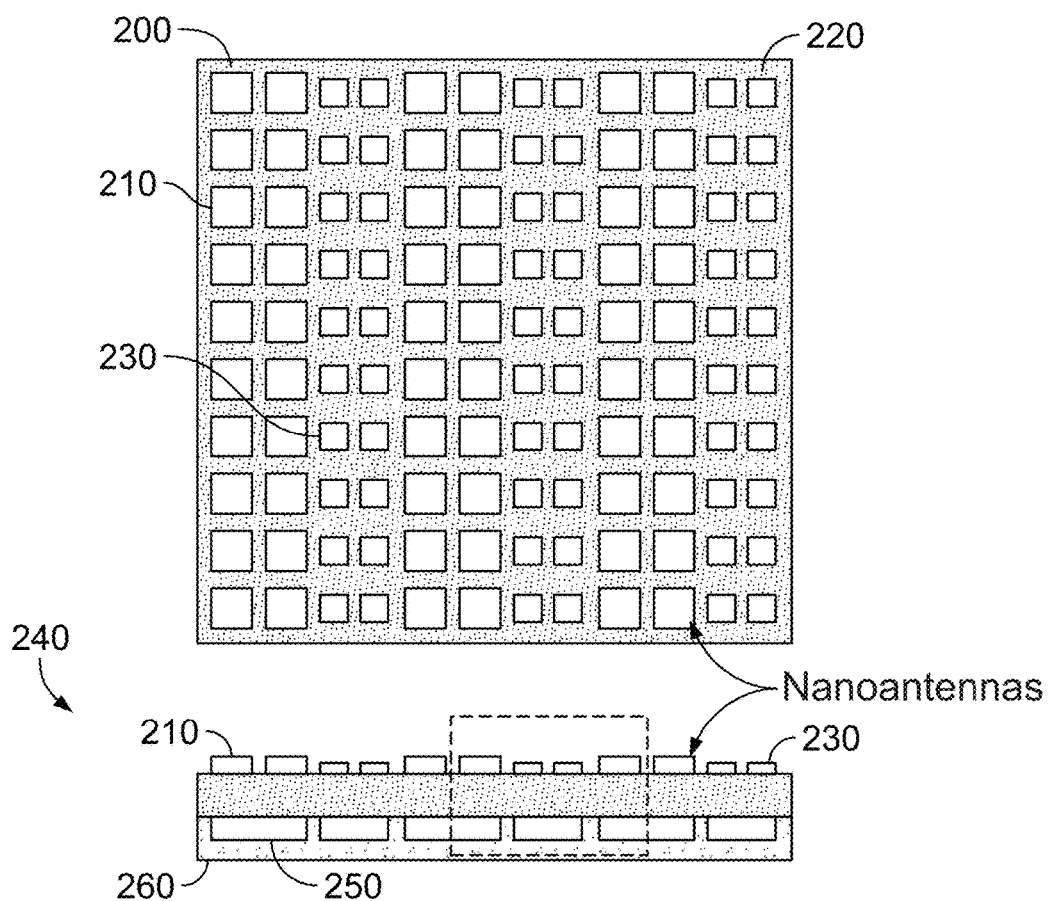
FIG. 2A is a cartoon diagram of a single detector pixel in a configuration in which the nanoantenna elements are of two different sizes.

By way of illustration, FIG. 2A is a cartoon diagram of a single detector pixel in an example embodiment having a columnar arrangement of nanoantenna elements. As shown, columns 200 of larger elements 210 alternate with columns 220 of smaller elements 230. The larger elements constitute one subpattern, and the smaller elements constitute another subpattern of nanoantenna elements.

In the embodiment shown in FIG. 2A, all columns have the same width, but the fraction of the column width that is covered with metal differs between the two subpatterns. We refer to this fraction as the "duty cycle".

It is not critical for the columns of the respective types to be equal in width. One possible reason to make the width for one color channel greater than the width for the other color channel is to make the detector pixel more sensitive in the color channel having the greater width.

With further reference to FIG. 2A, it will be seen that the nanoantenna elements 210, 230 are disposed over the front surface of a body 240 of detector material, and electrical contacts 250 for charge collection are disposed on the backside of the detector material body. Cladding layers 260 cover the front and back faces of the detector material body. (To simplify the drawing, cladding layers are not shown.) In some embodiments, the cladding layers may be composed of doped III-V semiconductor material or other material having a significant electrical conductivity.

The backside contacts collect photogenerated carriers from the detector material. Each color channel has its own set of backside contacts. There is also a common electrode, although it is not shown in FIG. 2A. The common electrode is accessible from the backside of the detector pixel, but it extends vertically through the detector pixel structure and makes electrical contact near the top of the detector material. Examples are described below. It should be understood that the arrangement of electrical contacts described here is exemplary and nonlimiting.

Figure 2B:
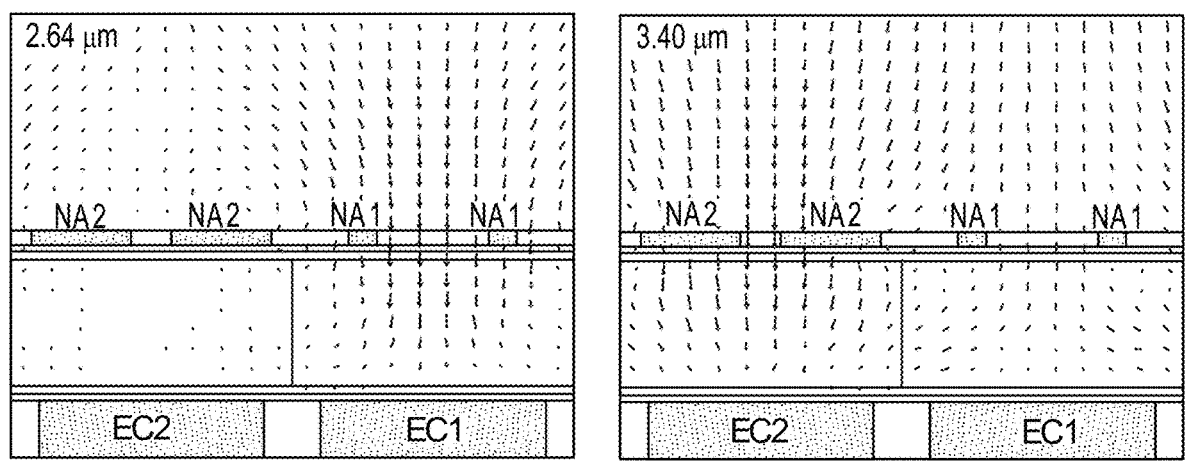
FIG. 2B is a theoretical plot showing electric field streamlines for two different wavelengths, near a detector pixel in which the nanoantenna elements have different sizes, dimensioned to resonate at the respective wavelengths.

FIG. 2B is the result of another numerical simulation, more detailed than the simulation of FIG. 1. FIG. 2B shows the electric field streamlines for two different wavelengths. In the figure, the nanoantenna elements NA1 are dimensioned to resonate at a wavelength of 2.64 µm, and the nanoantenna elements NA2 are dimensioned to resonate at 3.40 µm. The two nanoantenna subpatterns have respective sets of backside electrical contacts EC1 and EC2.

The left-hand view in FIG. 2B shows the calculated field at 2.64 µm, and the right-hand view shows the calculated field at 3.40 µm. As seen, the funneling effect directs the incident energy from the upper half space so that a large fraction of the energy in each color channel lands on the respective nanoantenna element with which it resonates.

As those skilled in the art will recognize, a practical detector structure has a finite thickness of detector material in which the photogeneration of carriers takes place. For simplicity, the simulation that led to FIG. 1 disregarded this finite thickness and assumed an infinitely thin detector. By contrast, the simulation that led to FIG. 2B assumed a more realistic detector geometry.

It should also be noted that although the nanoantenna elements corresponding to the respective color channels are separated from each other on a sub-pixel length scale, they will typically share the same body of underlying detector material. Such an arrangement is susceptible to crosstalk between color channels due to carriers diffusing laterally to the wrong electrical contact. This problem is especially grave when the physical spacing between color channels approaches or exceeds the detector thickness. Hence, it is preferable to use a detector layer that is thin enough for the respective photocarrier currents to remain well separated. The field streamlines depicted in the lower half-space in FIG. 2B show such good separation. Below, we will describe one example of thin detector technology that is suitable for this purpose.

Figure 3A:
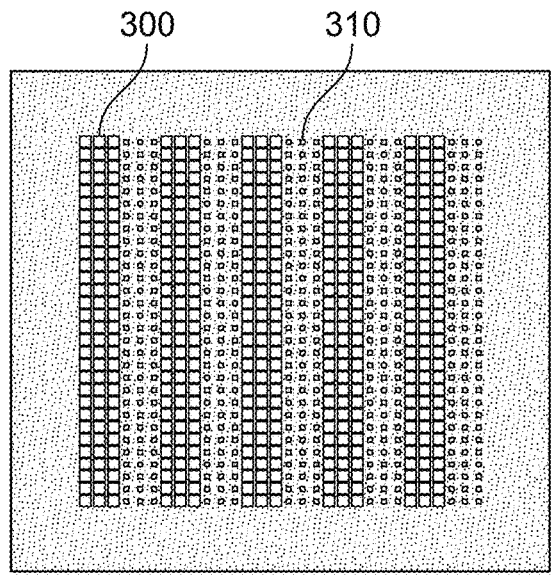
FIG. 3A is a top view of a detector pixel in which columns of pad-like long-wavelength (referred to below as "red") nanoantenna elements alternate with columns of pad-like short-wavelength (referred to below as "blue") nanoantenna elements.

The columnar arrangement of nanoantenna elements in each of the two subpatterns facilitates charge collection in two separate color channels. For example, FIG. 3A is a top view of a detector pixel in which columns 300 of pad-like long-wavelength (referred to below as "red") nanoantenna elements alternate with columns 310 of pad-like short-wavelength (referred to below as "blue") nanoantenna elements. Each column in the implementation shown is three elements wide.

Figure 3B:
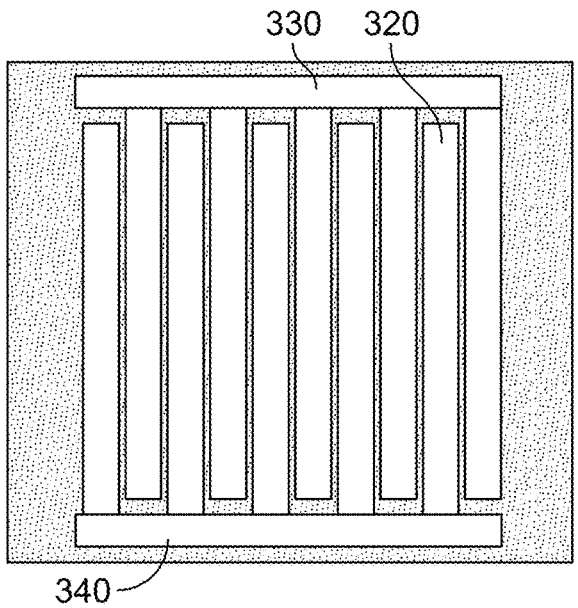
FIG. 3B is a bottom view of the detector pixel of FIG. 3A, showing electrode fingers that underlie respective columns of nanoantenna elements.

On the backside of the detector pixel, a comb of electrode fingers collects charge from the red elements, and another, similar, comb collects charge from the blue elements. This is best understood from FIG. 3B, which is a bottom view of the detector pixel of FIG. 3A. As seen in the figure, each electrode finger 320 underlies a respective column of nanoantenna elements and is matched to its footprint. The two combs of electrode fingers are interdigitated, and within each respective comb, the electrode fingers are all connected to a bus bar 330, 340 for signal extraction in the pertinent color channel.

The topside metallization for the nanoantenna elements and the backside metallization for the backside contacts can be fabricated using electron-beam lithography. In examples, the detector material body is the epitaxial layer structure of an epitaxial III-V photodetector such as a T2SL detector. Bodies of that kind may in at least some cases be transparent to the electron beam of the lithography tool. In such cases, at least, the backside metallization pattern can readily be aligned to the frontside pattern.

A "T2SL detector" is a detector in which the absorber layer is conformed as a Type-II strained-layer superlattice. It is noteworthy in this regard that T2SLs having compositions in the III-V material system are receiving current interest as useful absorber layers in epitaxial semiconductor photodetectors. For example, M. D. Goldflam et al., "Enhanced infrared detectors using resonant structures combined with thin type-II superlattice absorbers," Appl. Phys. Lett. 109, 251103 (2016), the entirety of which is hereby incorporated herein by reference, describes a nanostructure-enhanced T2SL detector in which a superlattice with a total thickness of 1.77 µm consists of alternating layers of InAs and $InAs_{1-x}Sb_x$, each layer several nanometers thick. The superlattice in Goldflam et al. was designed for a spectral region of interest from 8 µm to 11 µm. The theoretical absorption peak of the detector structure absent the nanoantenna (as predicted by numerical simulation) was at 9.65 µm.

T2SLs are well suited for combination with resonant structures owing to their widely tunable band gap, which can be controlled by varying the layer thickness and composition for absorption over a wide range of frequencies.

Although we represented the nanoantennas, above, as constituted by pad-like elements, alternate implementations are possible in which each column is populated by one or more continuous, strip-like elements. (It should be noted that with strip-like nanoantenna elements, the detector response may be polarization-dependent.) By way of illustration, FIG. 4A is a top view of an implementation with strip-like elements 400, 410, and FIG. 4B is a top view of a corresponding implementation with pad-like elements 420, 430.

Figure 4A:
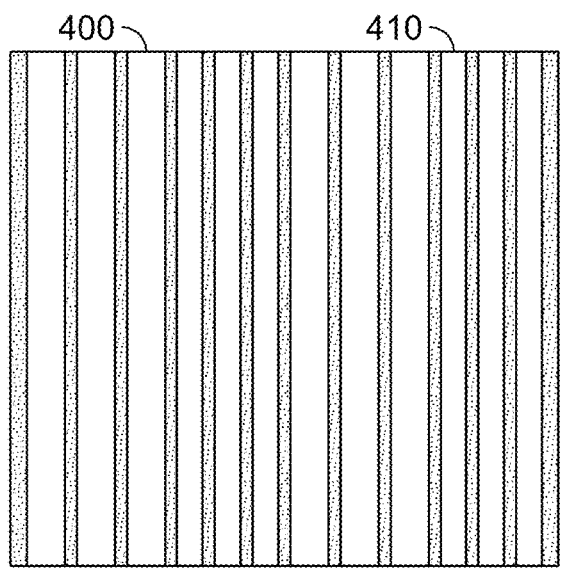
FIG. 4A is a top view of a detector pixel implementation with strip-like nanoantenna elements.
Figure 5A:
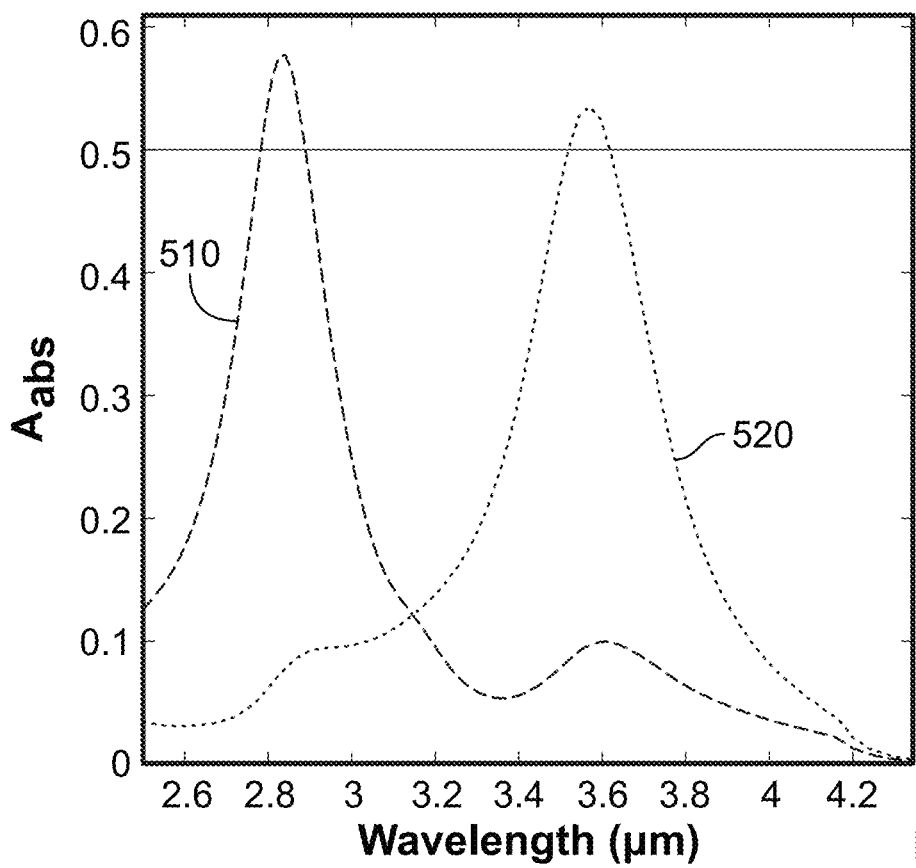
FIG. 5A is an absorption spectrum of a device according to FIG. 4A, obtained by 2D numerical simulation of the device after optimization for high quantum efficiency in each channel. The optical absorption is plotted for TM polarization only.

FIG. 5A is an absorption spectrum of a mid-wave IR device similar to the device of FIG. 4A, obtained by 2D numerical simulation of the device after optimization for high quantum efficiency in each channel. The optical absorption is plotted for TM polarization only. Two curves 510, 520 are shown in the figure. Each curve is a plot of the theoretical absorption spectrum of a respective subregion of the detector, i.e. the subregion corresponding to a respective one of the two color channels. For purposes of the analysis presented here, the detector quantum efficiency is assumed to be equivalent to the absorption.

As seen in the figure, the blue channel 510 exhibited an absorption peak near 2.82 µm and the red channel 520 exhibited an absorption peak near 3.59 µm. As also seen in the figure, our simulation predicted a quantum efficiency reaching 50%.

Figure 4B:
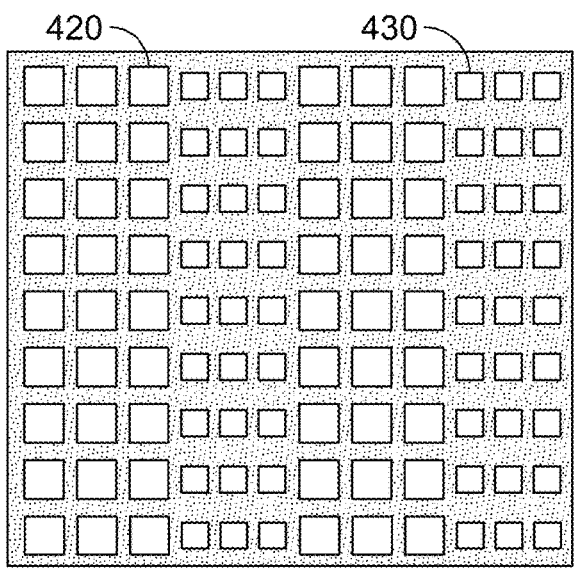
FIG. 4B is a top view of a detector pixel implementation with pad-like nanoantenna elements.
Figure 5B:
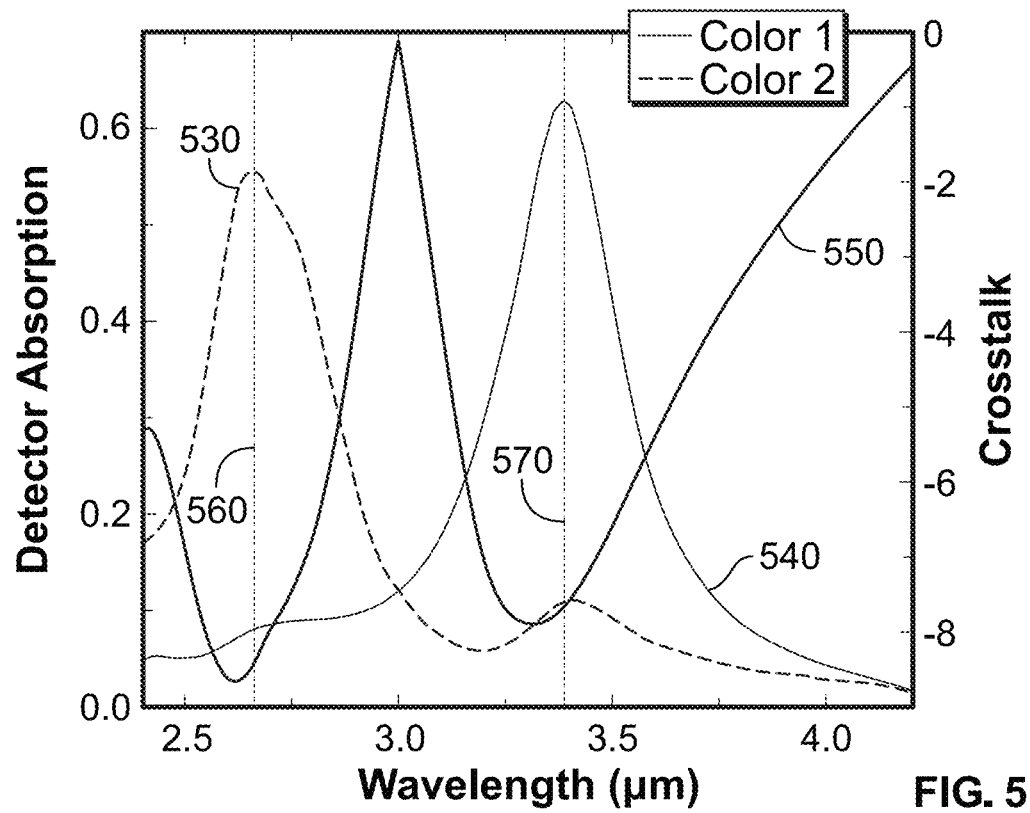
FIG. 5B is an absorption spectrum of a device according to FIG. 4B, obtained by 3D numerical simulation.

FIG. 5B is an absorption spectrum of a mid-wave IR device similar to the device of FIG. 4B, obtained by 3D numerical simulation. As seen in the figure, the blue channel 530 exhibited an absorption peak near 2.65 and the red channel 540 exhibited an absorption peak near 3.40 Quantum efficiencies near 50% were predicted.

As explained above, crosstalk can occur between color channels because within the common detector material body, carriers photogenerated near the nanoantenna elements of one color channel can migrate to the collection electrodes of the other color channel. The thicker the detector material body (i.e., the greater the vertical distance between the nanoantenna elements and the collection electrodes), the more the crosstalk that would be expected. This is an even greater problem when the dominant carrier mobility is substantially greater in the lateral direction than in the vertical direction as occurs, for example, in T2SL detectors.

We performed numerical simulations to confirm that signals could be extracted without a prohibitive amount of crosstalk. Our simulations showed that the bias voltage has a significant effect. For example, one study showed that increasing the magnitude of the bias from −0.1V to −0.3V increased the crosstalk rejection from an unacceptable level to 6 dB at peak absorption.

Figure 6:
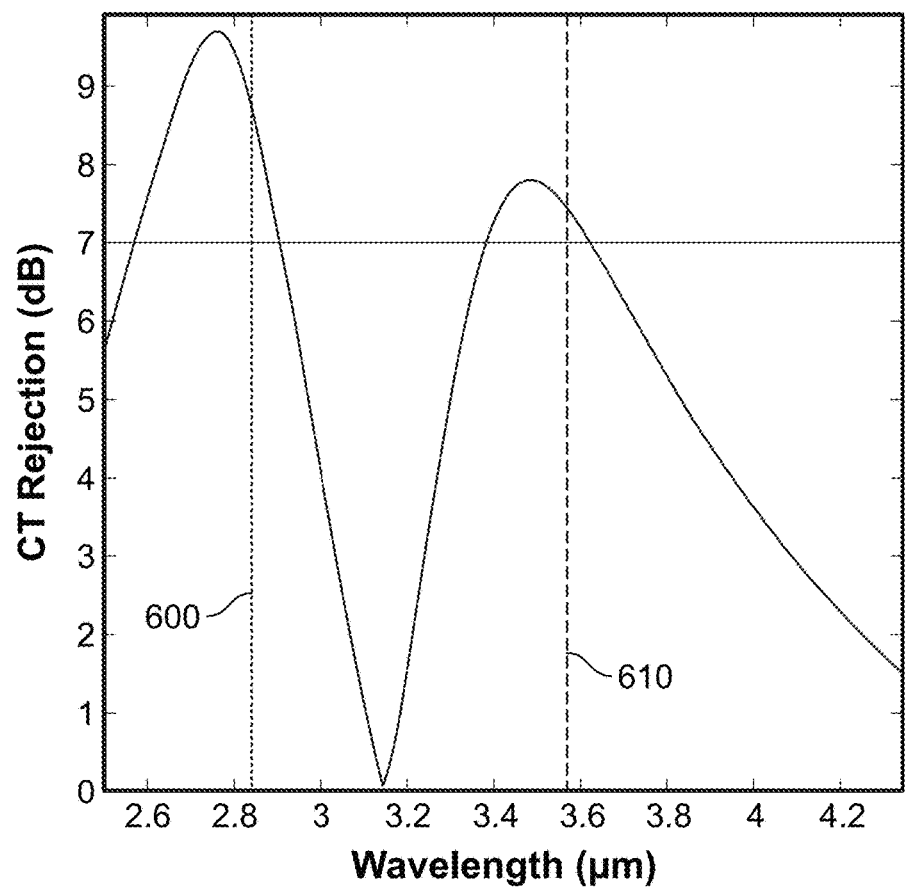
FIG. 6 is a graph illustrating crosstalk rejection in a 2D simulation of the detector pixel of FIG. 5A.

FIG. 6 is a graph illustrating crosstalk rejection in a 2D simulation of the detector pixel of FIG. 5A which, as noted, has strip-like nanoantenna elements. Crosstalk rejection is calculated as the log ratio of the respective absorption values at each wavelength. As seen in the figure, crosstalk rejection of 7 dB was predicted at peak absorption. The wavelengths of peak absorption are indicated by vertical lines 600, 610 superimposed on the graph.

Turning back to FIG. 5B, it will be seen that the figure includes a plot 550 of crosstalk superimposed on the absorption spectra. As shown, crosstalk rejection better than 7 dB was predicted at peak absorption 560, 570.

In example devices, the nanoantenna elements are not electrically active and are not tied to ground. To provide output signals for processing, a readout integrated circuit (ROIC) is advantageously attached to the detector wafer. This can be done, for example, using indium solder bumps to connect the ROIC to electrical contacts on the backside of the detector wafer.

The number of nanoantenna elements in each detector pixel may vary widely, and it may be dictated in part by spatial constraints. FIG. 4B, for example, provides an example of a detector pixel with 108 pad-like nanoantenna elements. However, substantially smaller or greater numbers of elements could be acceptable in particular embodiments. As noted above, the uniformity of the nanoantenna array affects the detector response. It may therefore be advantageous to design the detector pixels with a relatively small spacing between nanoantenna elements not only within individual detector pixels, but across the detector as a whole.

Figure 7:
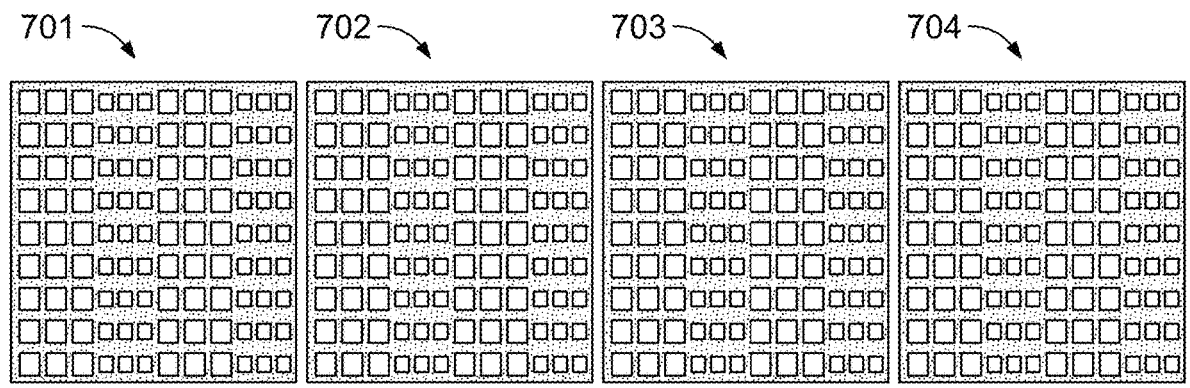
FIG. 7 is a cartoon drawing of a portion of a focal plane array, seen in plan view, in which each detector pixel is configured for two color channels.

FIG. 7 is a cartoon drawing of a portion of a focal plane array, seen in plan view. In the figure, four detector pixels 701-704 are aligned in a row along a horizontal direction to be referred to here as the x-direction. As noted above, each detector pixel contains one or more columns of nanoantenna elements in each of the two color channels. In the view of FIG. 7, each column is extensive in the y-direction perpendicular to the x-direction.

It will be evident from FIG. 7 that in order to take full advantage of the field-line funneling, and thus to achieve full coverage in both color channels, the side-to-side spacing between adjacent detector pixels should maintain the continuity of the pattern of columns across the detector as a whole.

In our numerical design studies, we gave equal widths to the differently colored columns, which were contiguous to each other, but we varied the duty cycle between columns. When simulating pad-like nanoantenna elements, we assumed square dimensions. We found that functionality could be maintained at a duty cycle as small as 0.1.

As noted above, the peak resonance depends on the thickness and complex refractive index of the detector layer and on the nanoantenna dimensions. In our numerical design studies, we found that by varying the nanoantenna dimensions in devices designed for the middle-wave infrared (MWIR) and long-wave infrared (LWIR) spectral regions, we could separate the peak wavelengths of the two color channels by as much as about 2 Examples of our LWIR designs were tuned to 8.0 µm and 9.5 µm. Examples of our MWIR designs were tuned to 2.5 µm and 3.5 µm.

Extensions to other wavelengths are achievable through scaling of the nanoantenna dimensions and through suitable material choices for the detector. We believe that this approach can even be extended into the short-wave infrared (SWIR) region, although in that region, scaling of the nanoantenna dimensions will be limited by the resolutions achievable with electron-beam lithography. Even so, we believe that peak wavelengths as low as 1.0-1.5 µm could be reached.

The approach described here can also be extended to more than two color channels. For example, detector pixels tuned to a first pair of color channels can be alternated in the focal plane of the detector with detector pixels tuned to a different pair of color channels. Such an arrangement may be useful, although it will not achieve the full benefit of the coverage-enhancing fieldline funneling effect described above.

Figure 8:
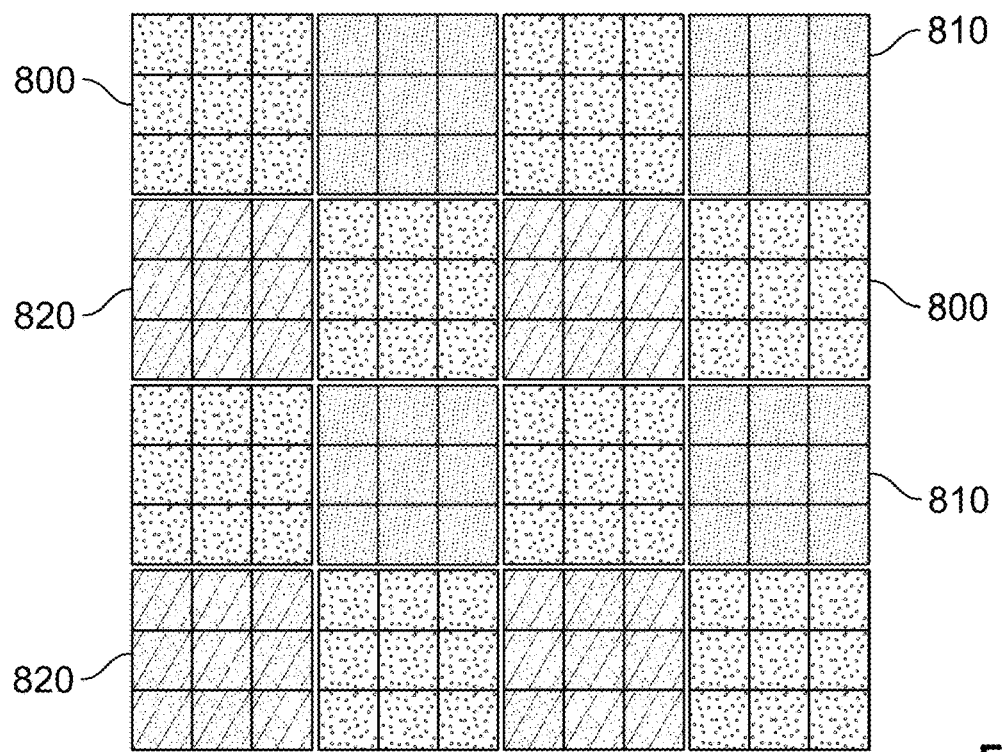
FIG. 8 notionally illustrates an extension of our two-color concept for adding a third color channel.

In another example, FIG. 8 shows a checkerboard arrangement within a single detector pixel, in which a first nanoantenna subpattern 800 alternates with a second subpattern 810 in the x-direction and alternates with a third nanoantenna subpattern 820 in the y-direction. Such an arrangement can provide some improved coverage due to the fieldline funneling effect, but it may also be more polarization-dependent than two-color versions. As a consequence, no more than 50% efficiency is expected. Also, multilayer metallization on the backside of the detector wafer could be needed in order to extract the charge-collection current from the third color channel.

In a possible application, two respective subpatterns have different, but overlapping, sensitivity spectra. Logical circuitry can make inferences by comparing the responses of the two subpatterns. For example, a third color channel can be defined as the sum or difference of the respective responses. In embodiments, such an approach can emulate aspects of the neural processing in human color vision.

Figure 9:
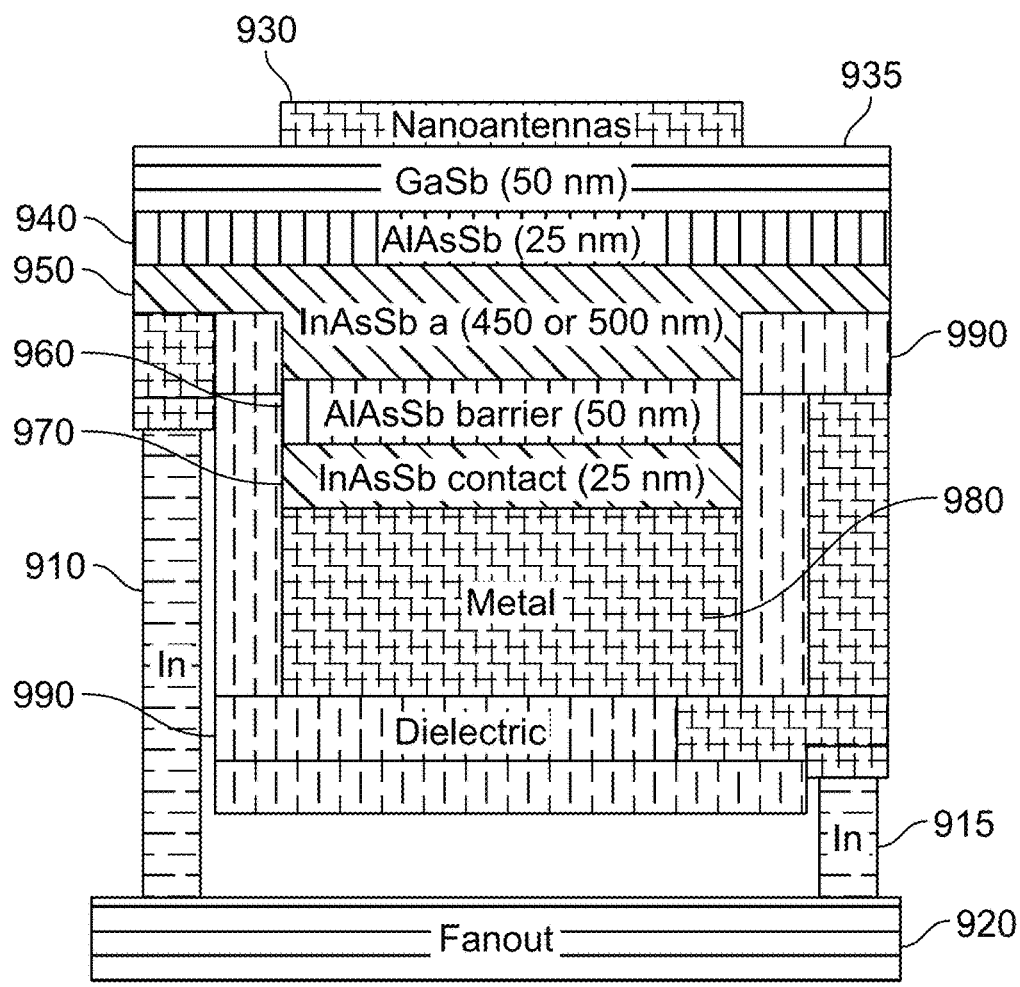
FIG. 9 is a cross-sectional cartoon drawing showing, in an example embodiment, a detector pixel for a mid-wave infrared detector.

FIG. 9 is a cross-sectional cartoon drawing showing, in an example embodiment, a detector pixel for a mid-wave infrared detector. In the arrangement shown in FIG. 9, the semiconductor layers of the detector pixel are connected through indium solder bumps 910, 915 to a fanout chip 920. InAsSb absorber layer 950 of the detector pixel is shown connected through indium solder bump 910 to the fanout chip. In practical applications, the detector pixel can be flip-chip bonded, for example, to a readout integrated circuit (ROIC) in place of the fanout chip.

The layers of the detector pixel, listed sequentially from front to back, include the patterned metal nanoantenna array 930, a 50-nm GaSb passivation layer 935, a 25-nm AlAsSb passivation layer 940, the 450-nm or 500-nm InAsSb absorber layer 950, a 50-nm AlAsSb barrier layer 960, a 25-nm InAsSb contact layer 970, and the metallization 980 for the charge-collection electrodes. A dielectric encapsulant 990 is shown on the sides and back of the detector pixel. The specific composition of the encapsulant is not critical. Examples of suitable encapsulant materials include silicon nitride, silicon dioxide, alumina, hafnia, and possibly also yttria and zirconia.

All dimensions provided here are meant only as a single illustrative example, and should not be understood as limiting.

Figure 10:
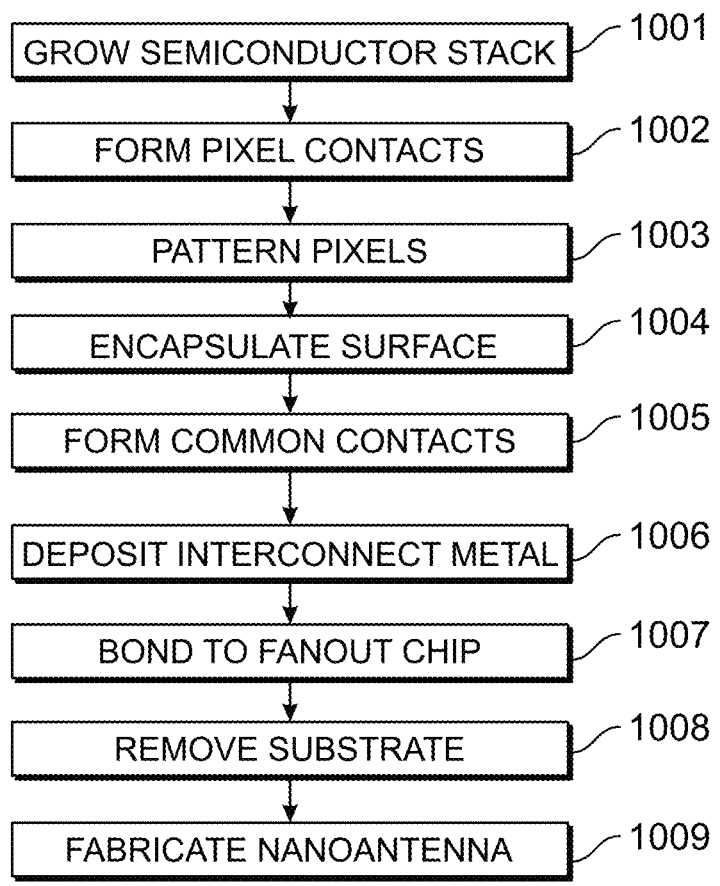
FIG. 10 illustrates an exemplary sequence of fabrication steps for making the detector of FIG. 9.

FIG. 10 illustrates an exemplary sequence of fabrication steps for making the detector of FIG. 9.

In sequence, these steps are: Grow the stack of semiconductor layers (1001); form the detector pixel contacts (1002); pattern the detector pixels (1003); encapsulate the surface (1004); form the common contacts (1005); deposit the interconnect metal (1006); bond the detector pixel chip to the fanout chip (1007); remove the substrate from the detector pixel chip (1008); and fabricate the nanoantenna (1009). More information about these steps is provided below.

Figure 11:
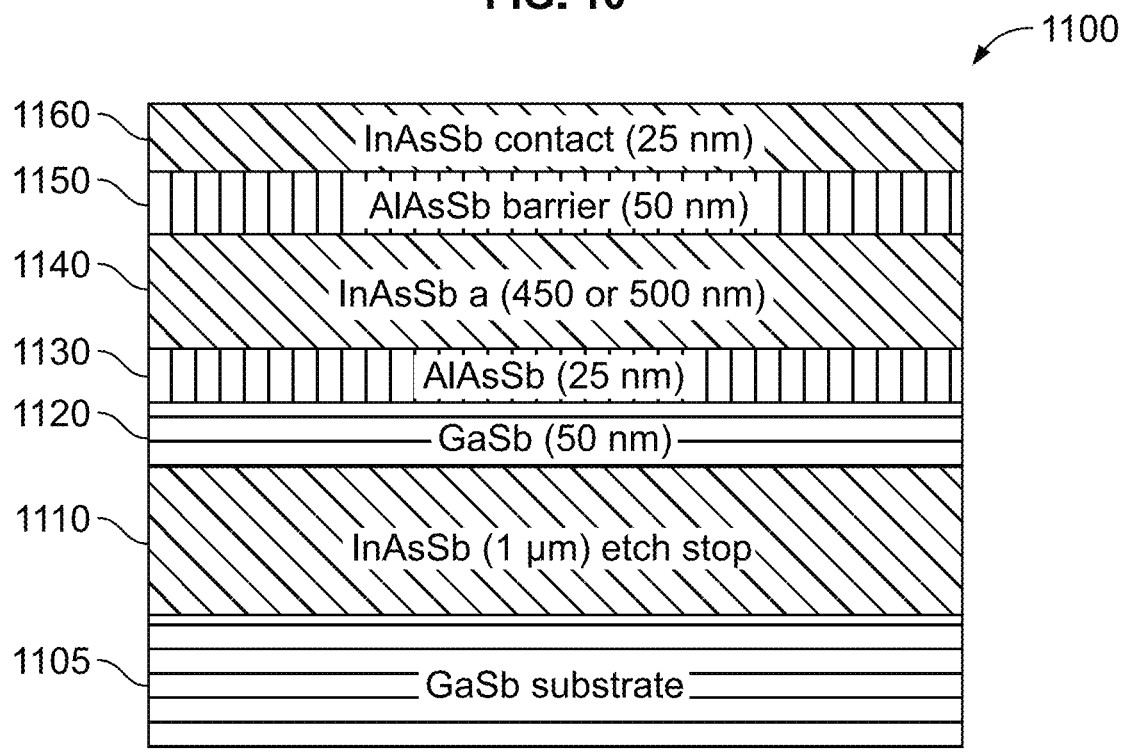
FIG. 11 is a schematic drawing, not to scale, of the initial semiconductor stack for the fabrication process of FIG. 10.

1001. The initial semiconductor stack 1100 is shown in FIG. 11. As seen in the figure, the layers epitaxially grown on a GaSb substrate 1105, in sequence, are InAsSb etch stop layer 1110 (1 μm), GaSb layer 1120 (50 nm), AlAsSb absorber passivation layer 1130 (25 nm), InAsSb absorber layer 1140 (450 nm or 500 nm), AsAsSb barrier layer 1150 (50 nm), and InAsSb contact layer 1160 (25 nm).

Figure 12:
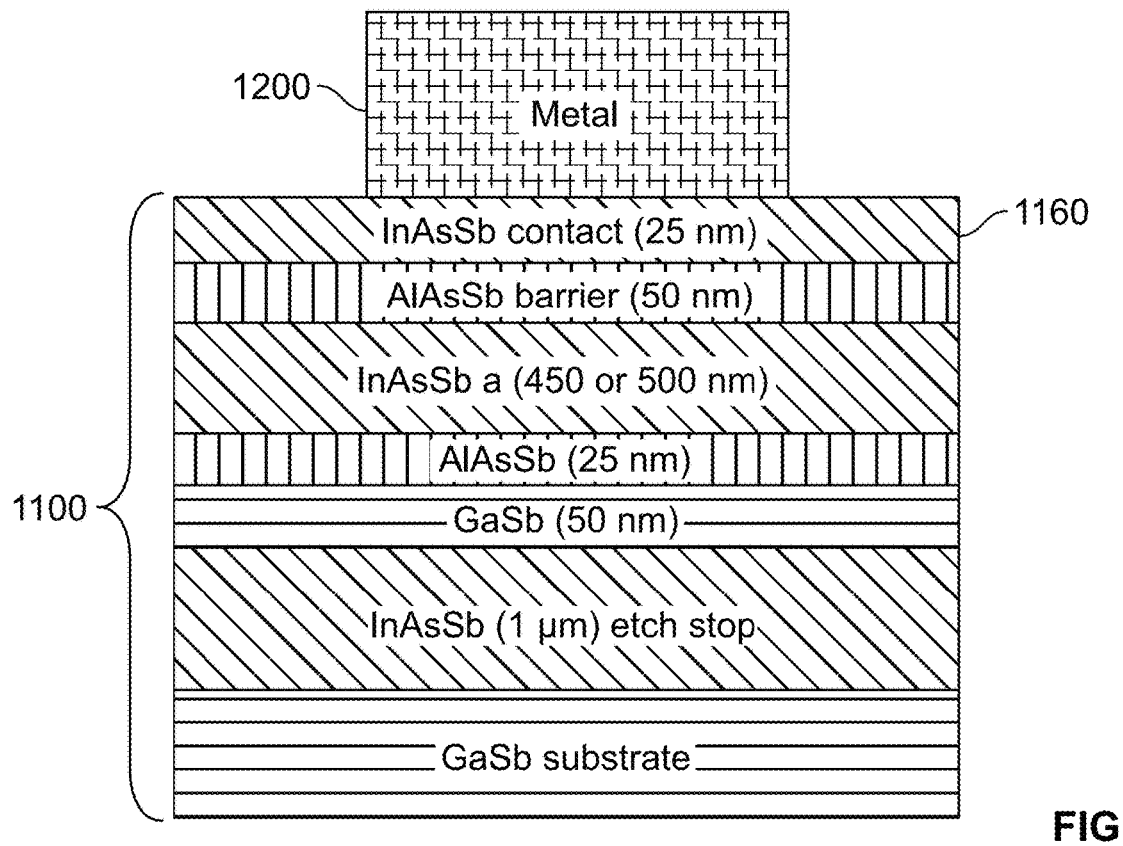
FIGS. 12-26 illustrate successive stages in the process of FIG. 10.

1002. Turning to FIG. 12, to form the detector pixel contacts, metal contacts 1200 are formed on the surface of the InAsSb contact layer 1160. A dip in 1:1 HCl:water removes the native oxide before depositing the metal that makes direct contact to the semiconductor.

The metal contacts are made of gold, 2000 Å thick, with an underlying diffusion barrier. A respective electrical contact is fabricated for each detector pixel by electron-beam lithography. The metal contacts will act as a self-aligned etch mask for the removal of the surrounding portions of the contact layer, so as to electrically isolate each detector pixel.

Figure 13:
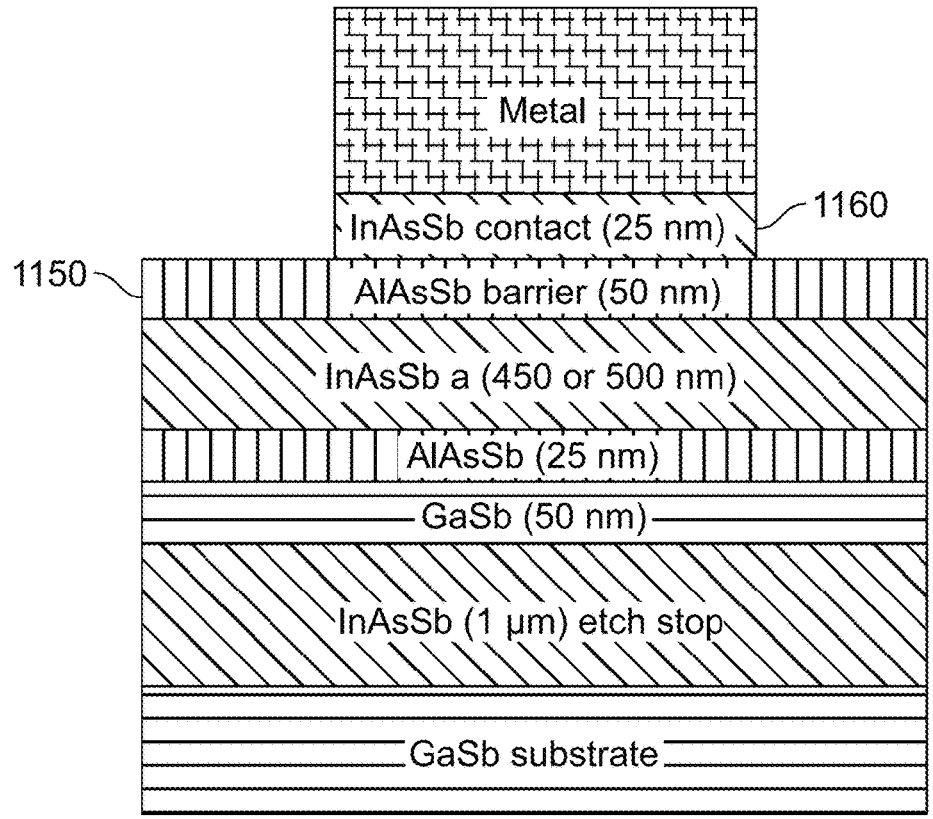

1003. Turning to FIG. 13, the detector pixels are patterned by performing a mesa etch through the cap layer, i.e. the InAsSb contact layer 1160, stopping on the AlAsSb barrier layer 1150. The etchant is 5:1 citric acid:hydrogen peroxide.

Figure 14:
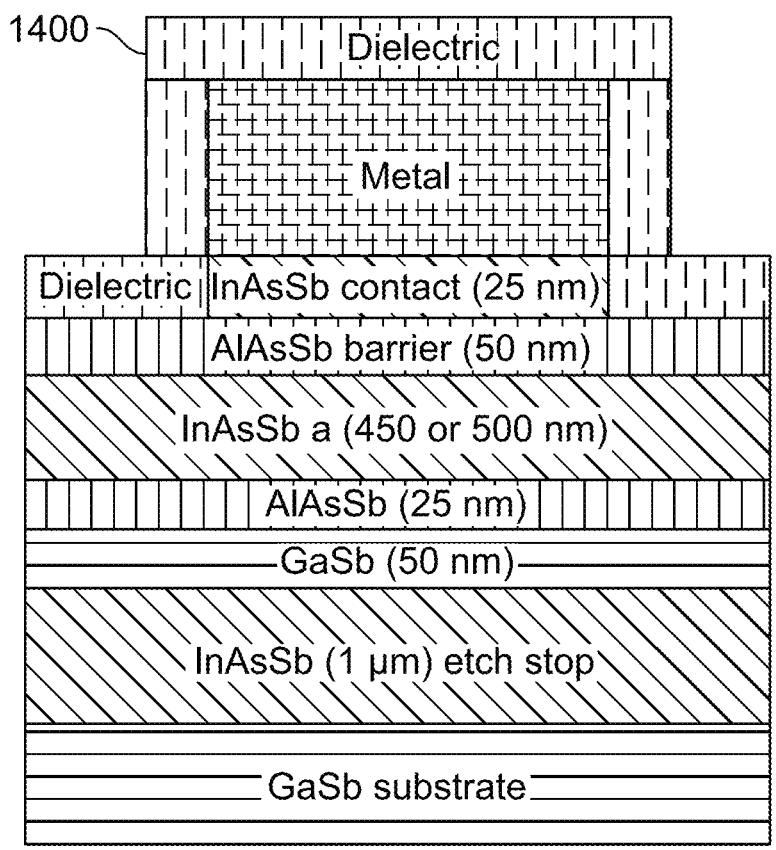

1004. Turning to FIG. 14, the surface is encapsulated with dielectric 1400, which in a typical example is deposited to a thickness of 2000 Å. It should be noted, however, that the precise thickness is not critical. For example, a thickness as low as 1000 Å may be acceptable for CVD-deposited silicon nitride or silicon dioxide. Even smaller thicknesses may be acceptable if sputter deposition or atomic layer deposition is used to deposit a dielectric layer of, e.g., alumina, hafnia, yttria, or zirconia.

Figure 15:
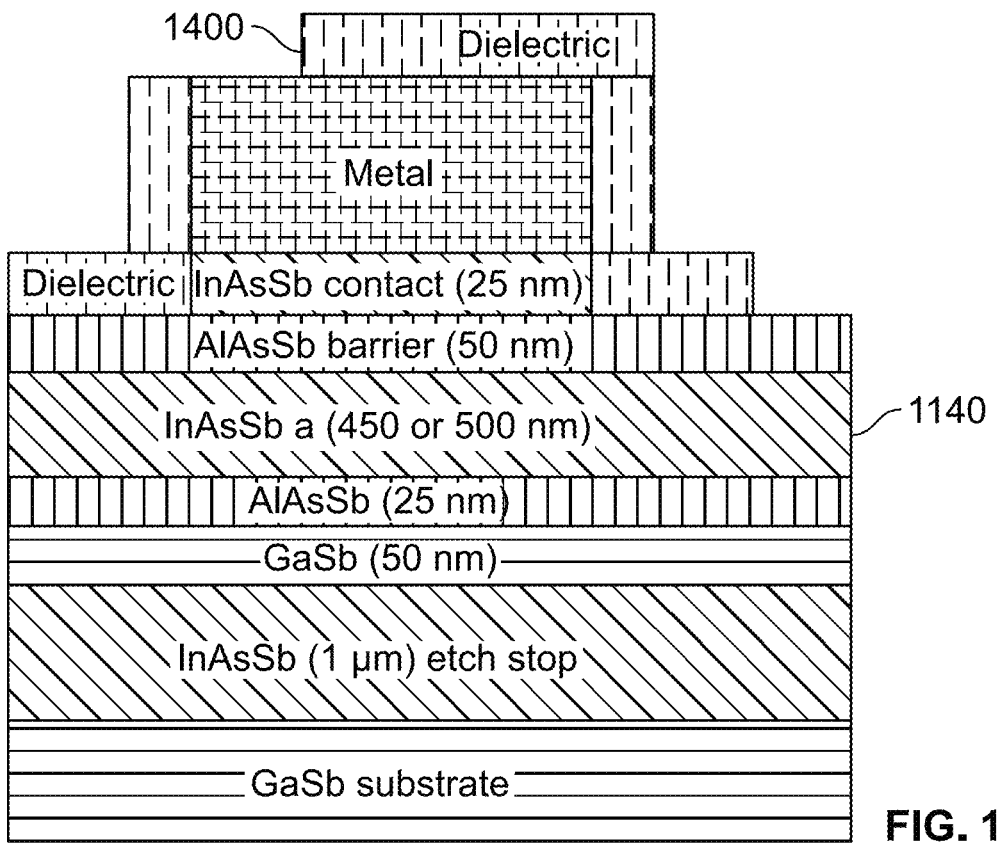

1005. To form the common contacts, contact to the absorber layer 1140 is initiated with an etch that defines trenches around the chip that will subsequently extend a shallow distance into the absorber layer. Ohmic metal contacts are deposited on the absorber layer. The etching begins at the dielectric encapsulant, as shown in FIG. 15. For example, encapsulant 1400 may be removed in places by reactive ion etching (RIE).

Figure 16:
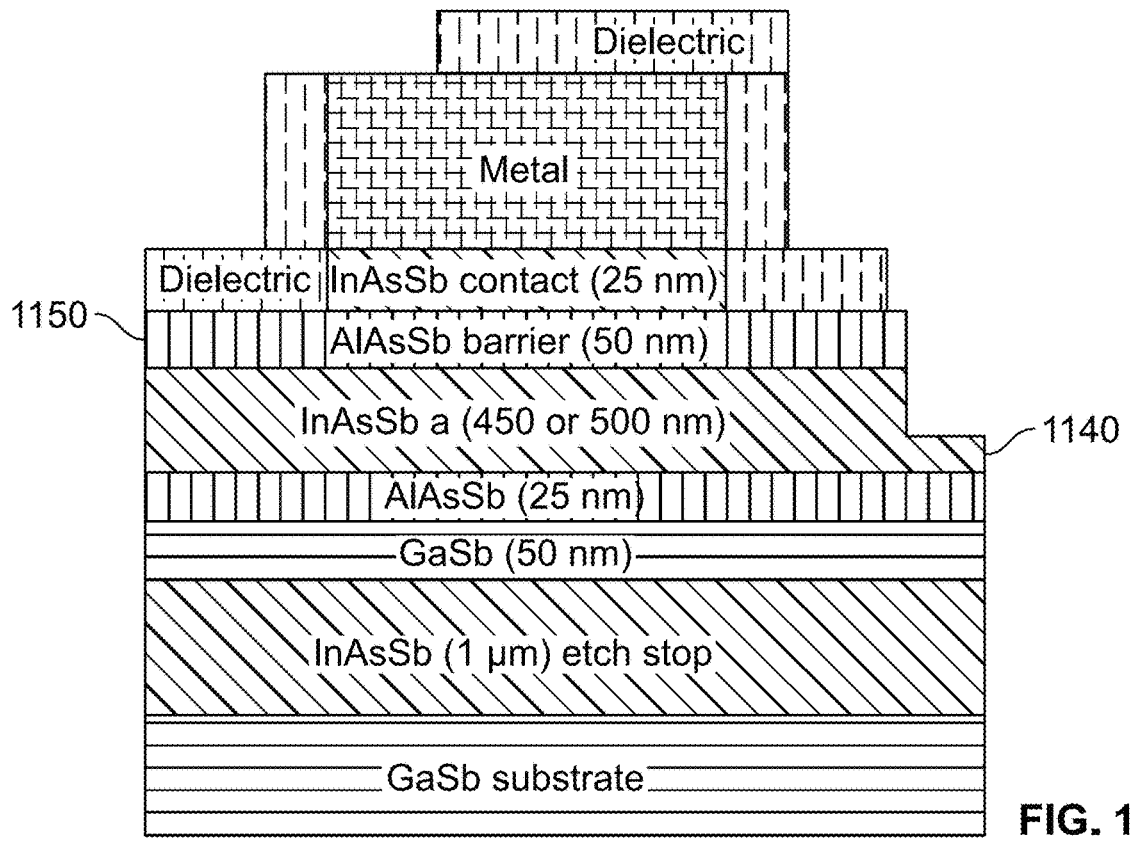

Turning to FIG. 16, material of barrier layer 1150 is then removed by wet chemical etching with $H_2O$:HF in a typical concentration ratio of 100:1. The last etch is a citric acid/hydrogen peroxide etch with a typical concentration ratio of 5:1. That etch advances partway into the absorber layer 1140. Additional penetrations into the absorber layer can be seen, for example, in FIGS. 20-26.

Figure 17:
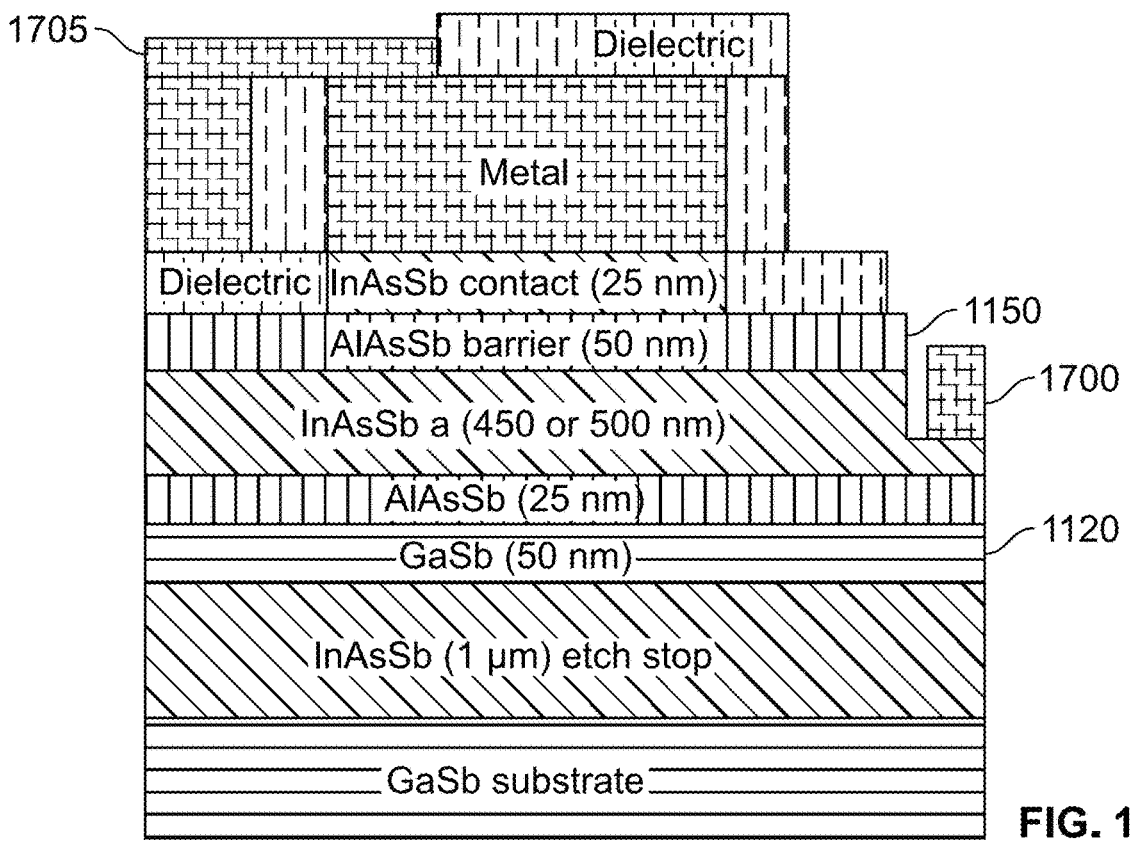

Turning to FIG. 17, metal contacts 1700, 1705, including the ohmic contacts 1700 to the absorber layer, are then deposited using a liftoff process. These contacts are gold, 2000 Å thick, with an underlying diffusion barrier.

Figure 18:
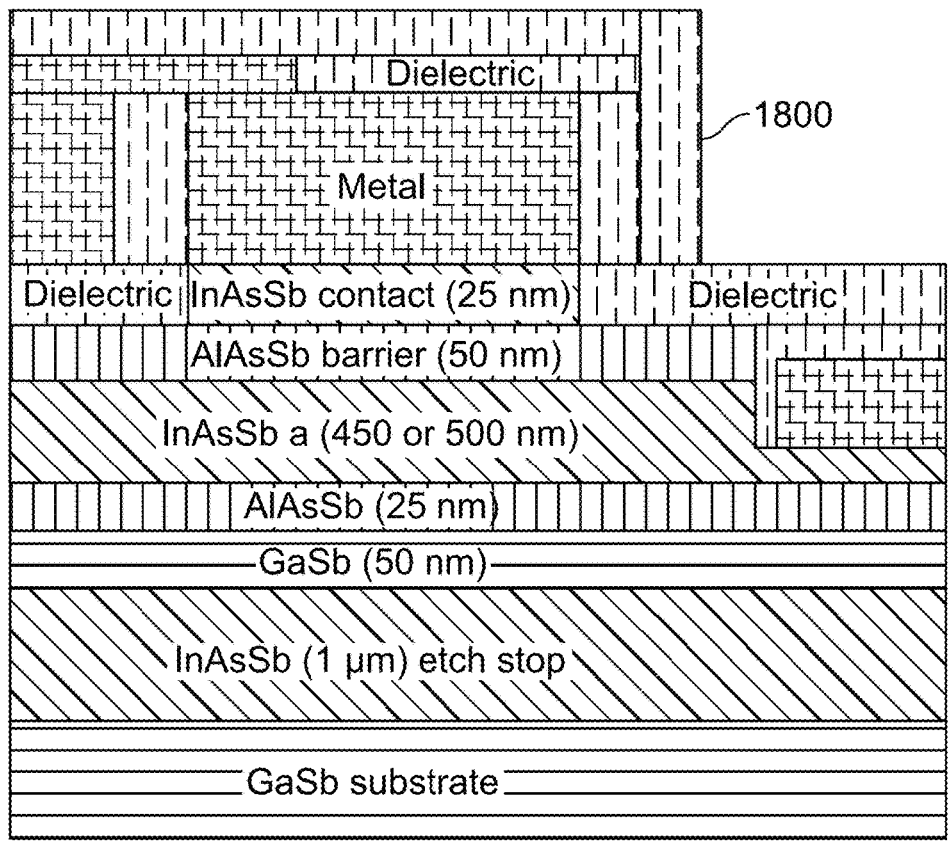

1006. Interconnect metals are deposited on the ohmic metal detector pixel contacts and common contacts. As shown in FIG. 18, the contacts are initially overcoated with a 2000 Å solder dam 1800 of dielectric material deposited by PECVD.

Figure 19:
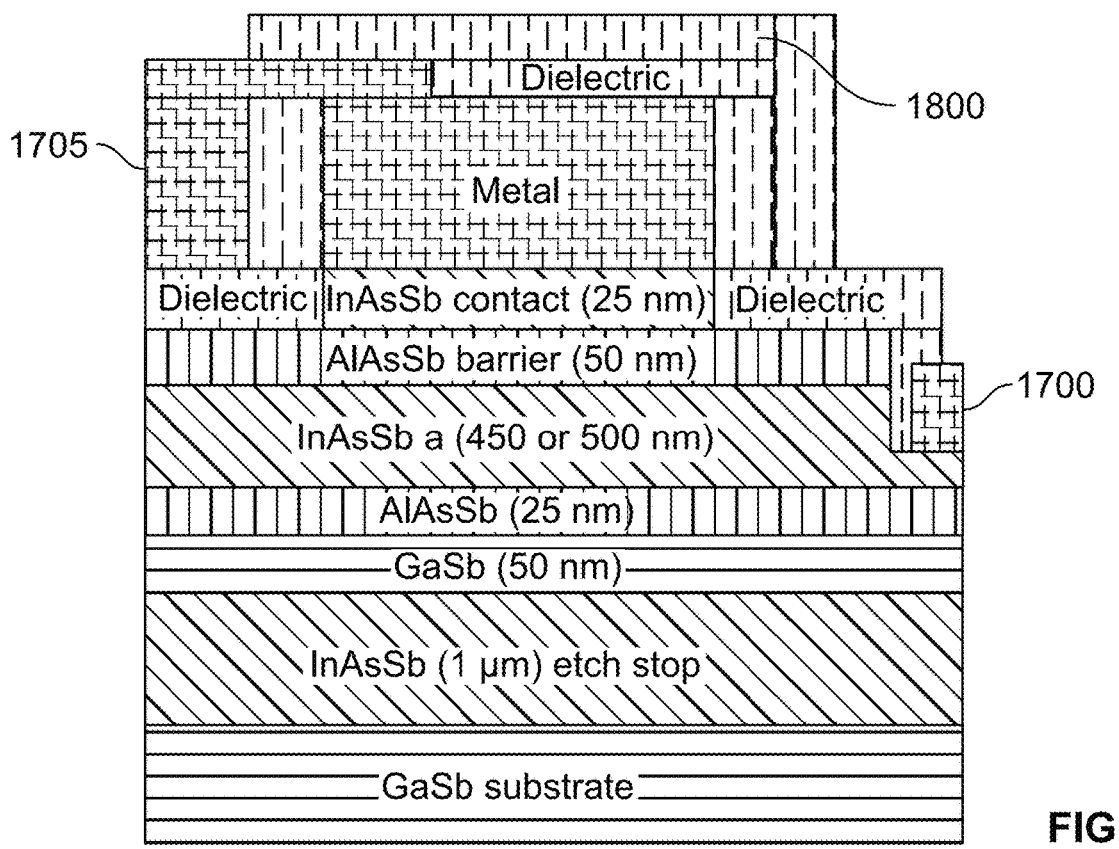

An etch through the solder dam 1800 exposes the contacts 1700, 1705, as shown in FIG. 19.

Figure 20:
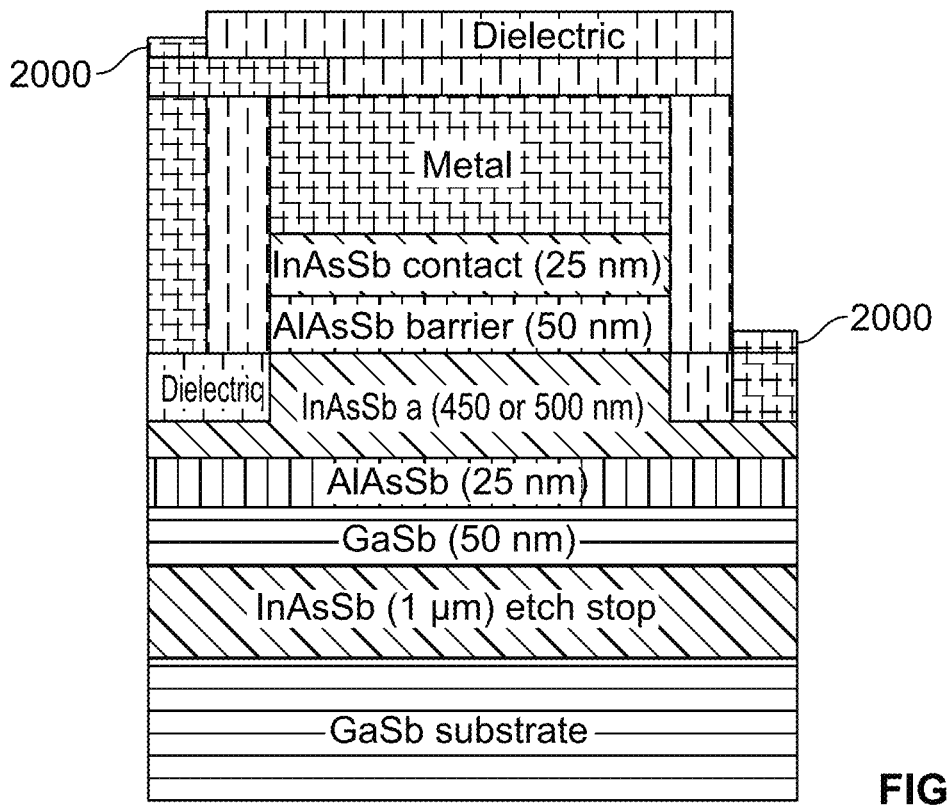

A metal layer 2000 of 250Å/1000Å/1000Å/2000Å Ti/Au/Ni/Au is deposited over the exposed contacts, as shown in FIG. 20.

Figure 21:
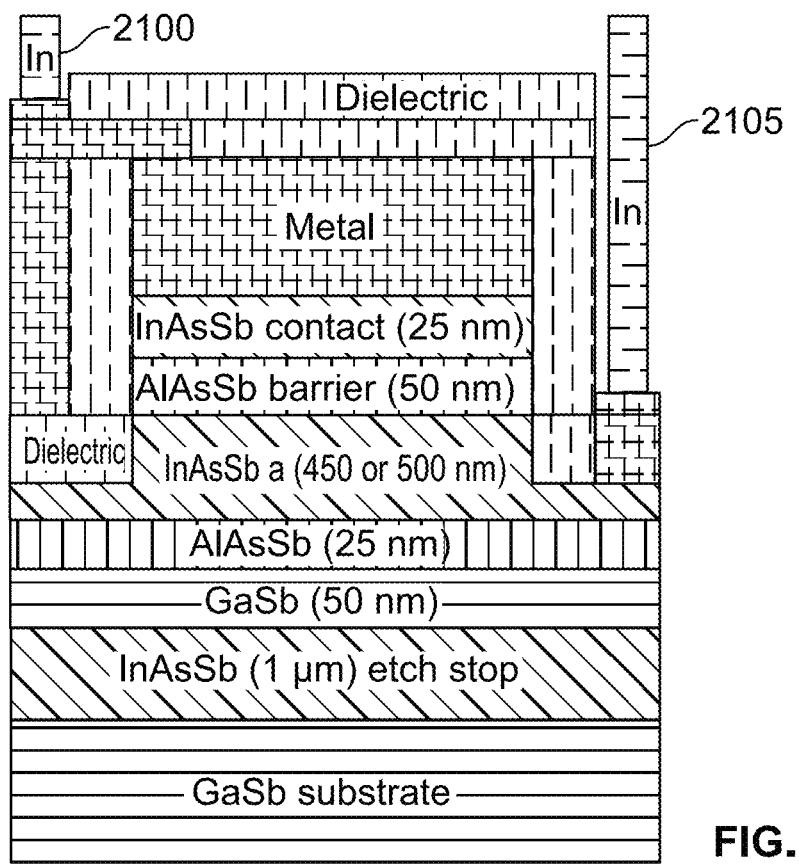

As shown in FIG. 21, this is followed by deposition of indium bumps 2100, 2105. In examples, the thickness of the indium bumps may be in the range 3-5 μm.

Figure 22:
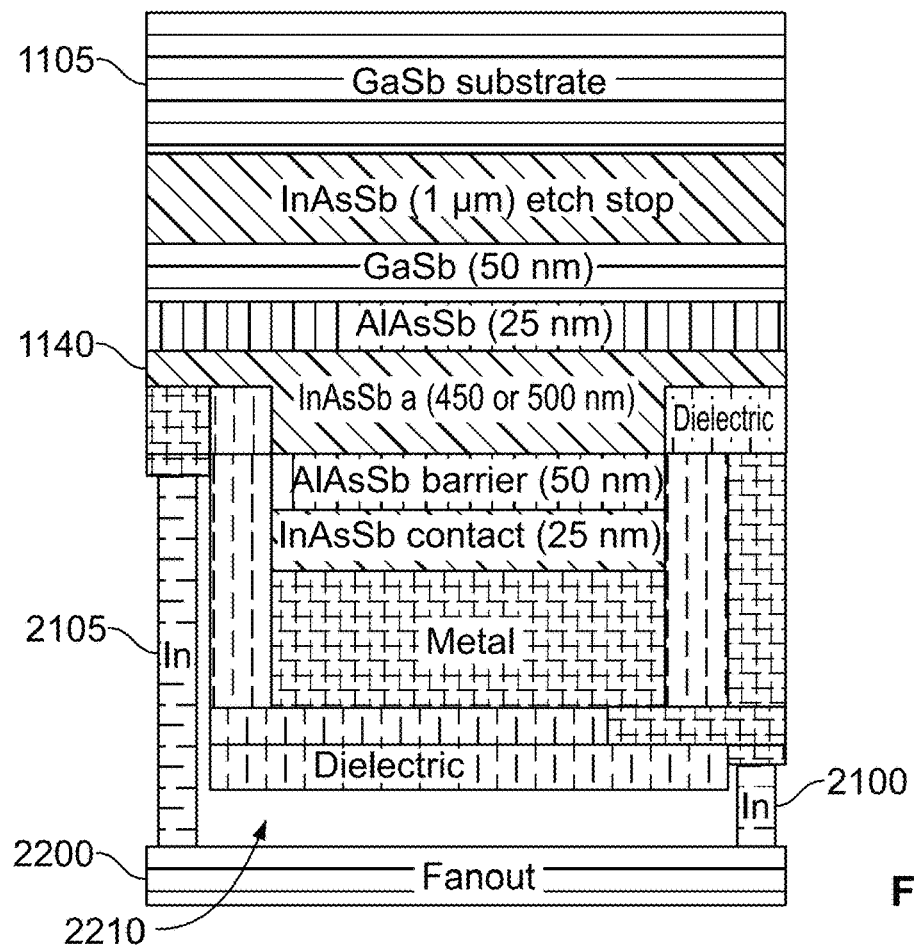

1007. Turning to FIG. 22, the photodetector is hybridized to a fanout chip or ROIC 2200 by flip-chip bonding, using the indium solder bumps. The gap 2210 between the photodetector array and the fanout chip is underfilled with an epoxy.

Figure 23:
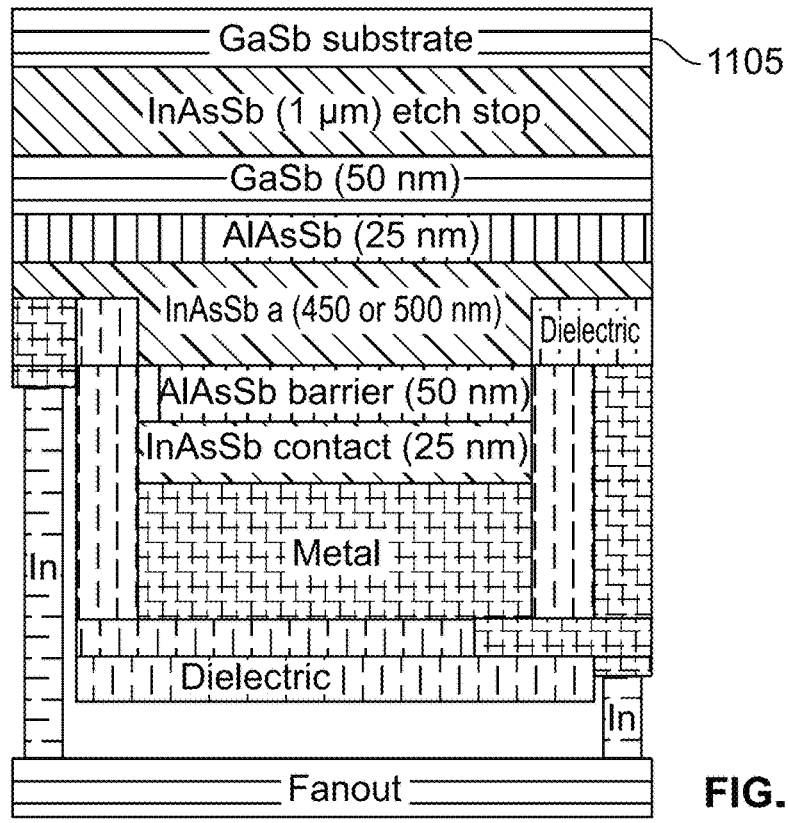

1008. Turning to FIG. 23, the GaSb substrate 1105 is thinned by lapping and polishing or by precision machining.

Figure 24:
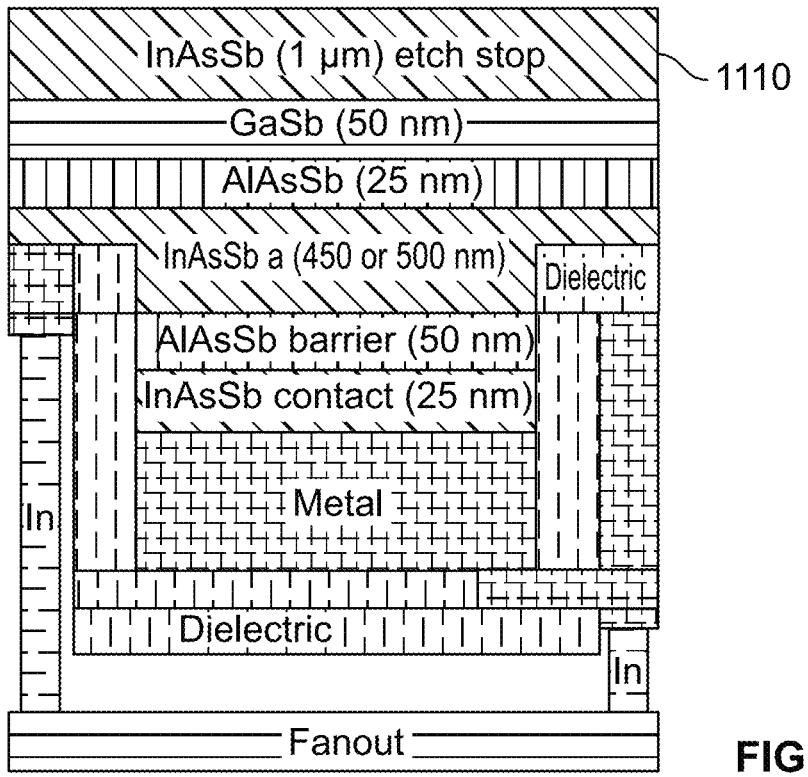

Turning to FIG. 24, the remaining portion of the GaSb substrate 1105 is removed by wet etch in $Cr_2O_5$:HF, with the etch stopping on the InAsSb etch-stop layer 1110.

Figure 25:
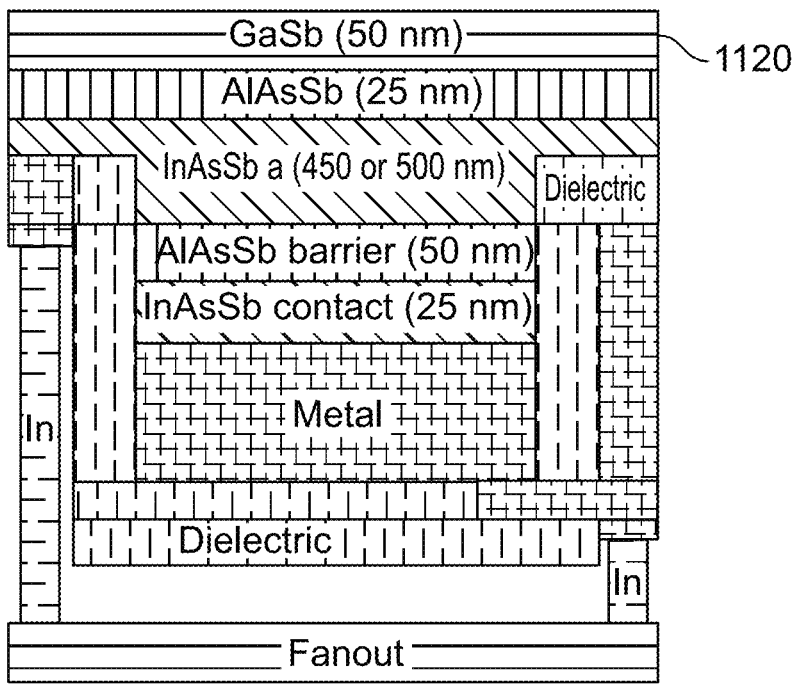

Turning to FIG. 25, the etch-stop layer 1110 is then removed by wet etch in citric acid:hydrogen peroxide, stopping on the underlying GaSb passivation layer 1120. In a typical example, the etchant concentration ratio is 5:1 citric acid:hydrogen peroxide.

Figure 26:
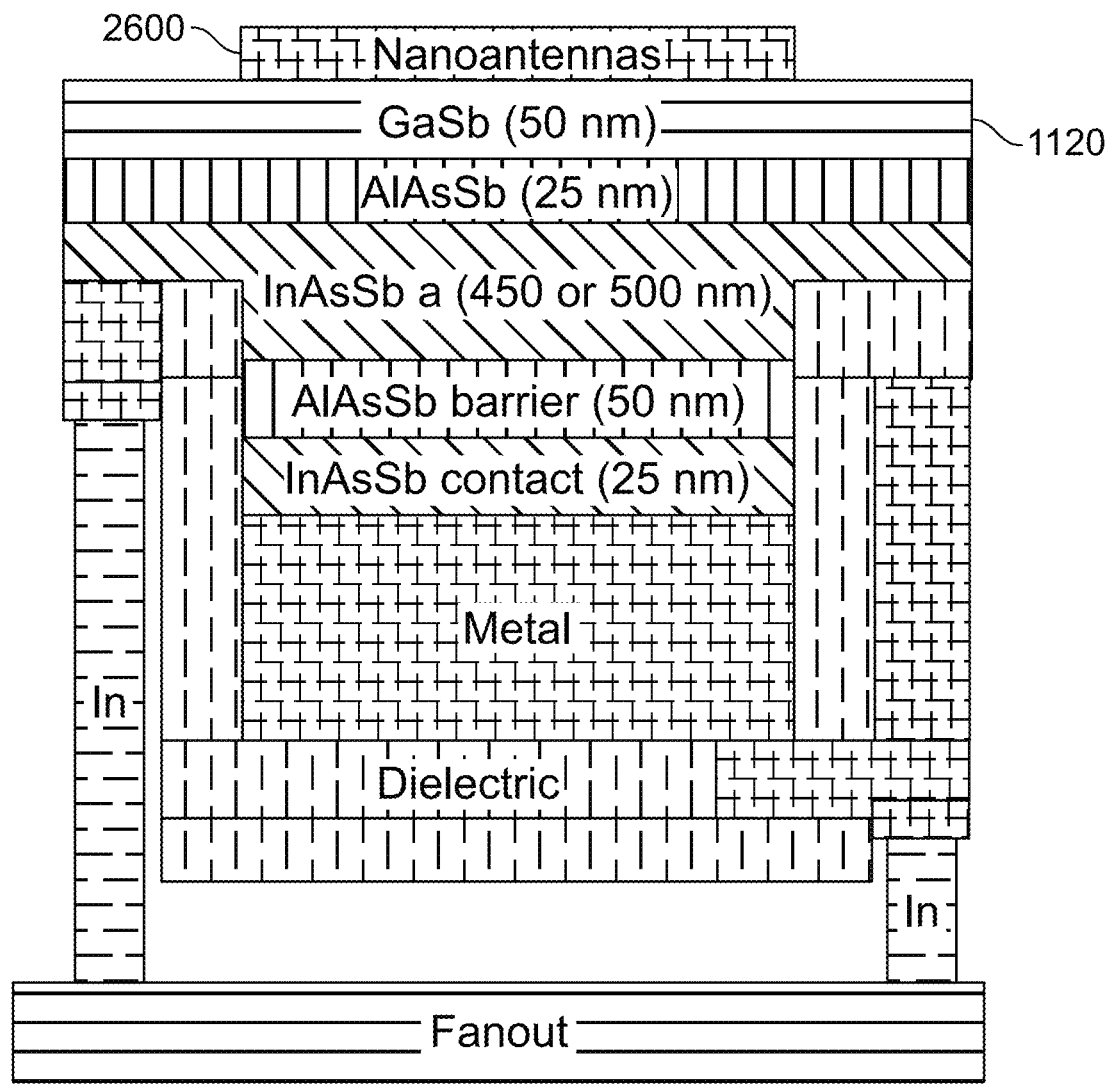

1009. Turning to FIG. 26, nanoantenna (NA) fabrication is done on the GaSb passivation layer 1120 using e-beam lithography. The nanoantenna metal 2600 is 500 Å gold.

We claim:

1. An apparatus for detecting infrared radiation, comprising:
   one or more detector pixels, each having a semiconductor portion;
   a first subpattern of one or more nanoantenna elements of a first size disposed on the semiconductor portion of each of the detector pixels;
   a second subpattern of one or more nanoantenna elements of a second size unequal to the first size, disposed on the semiconductor portion of each of the detector pixels and interpolated laterally between nanoantenna elements of the first subpattern;
   a first collection electrode for collecting photogenerated current from the first subpattern on each of the detector pixels; and
   a second collection electrode for collecting photogenerated current from the second subpattern on each of the detector pixels.

2. The apparatus of claim 1, wherein the first and second subpatterns each consist of a plurality of columns, and wherein the columns of the first subpattern alternate with columns of the second subpattern.

3. The apparatus of claim 2, wherein each column of the first and second subpatterns consists of a periodic array of pad-like nanoantenna elements.

4. The apparatus of claim 1, wherein each of a plurality of detector pixels has a first and a second nanoantenna subpattern and a first and a second collection electrode.

5. The apparatus of claim 4, wherein the plurality of detector pixels consists of detector pixels that are all disposed on a common semiconductor substrate.

6. The apparatus of claim 4, wherein the plurality of detector pixels constitutes a focal plane array (FPA).

7. The apparatus of claim 4, wherein:
   the plurality of detector pixels consists of detector pixels that are all disposed on a common semiconductor substrate;
   the plurality of detector pixels constitutes a focal plane array (FPA);
   the FPA further comprises a read-out integrated circuit (ROIC); and
   the ROIC is connected to the common semiconductor substrate such that the ROIC receives an input from the first collection electrode and from the second collection electrode of each detector pixel in the plurality of detector pixels.

8. The apparatus of claim 1, wherein the nanoantenna elements of the first and second nanoantenna subpatterns are dimensioned to provide resonances at respective, unequal, resonant vacuum wavelengths.

9. The apparatus of claim 8, wherein the nanoantenna elements in the first and second nanoantenna subpatterns are smaller in their lateral dimensions than their respective resonant vacuum wavelengths.

10. The apparatus of claim 1, wherein:
    each of said first and second subpatterns has a fill factor for collecting light from a field of view;
    each of said first and second subpatterns covers a coverage fraction of a detector pixel area; and
    the fill factor of each of the first and second subpatterns is greater than the corresponding coverage fraction.

11. The apparatus of claim 10, wherein each of the first and second subpatterns has a fill factor greater than 50% and a coverage fraction of 50% or less.

12. The apparatus of claim 1, wherein:
    the first subpattern has a first sensitivity spectrum;
    the second subpattern has a second sensitivity spectrum different from the first sensitivity spectrum; and
    the first and second sensitivity spectra overlap.

13. The apparatus of claim 12, further comprising a processing circuit conformed to compare a response from the first subpattern with a response from the second subpattern, and to provide an output based on the comparison of the respective responses.

* * * * *